United States Patent
Song

(10) Patent No.: US 8,126,166 B2
(45) Date of Patent: Feb. 28, 2012

(54) CONDENSER MICROPHONE AND PACKAGING METHOD FOR THE SAME

(75) Inventor: Chung Dam Song, Seoul (KR)

(73) Assignee: BSE Co., Ltd., Incheon (KR)

( * ) Notice: Subject to any disclaimer, the term of this patent is extended or adjusted under 35 U.S.C. 154(b) by 1175 days.

(21) Appl. No.: 11/519,551

(22) Filed: Sep. 12, 2006

(65) Prior Publication Data

US 2007/0057602 A1    Mar. 15, 2007

(30) Foreign Application Priority Data

Sep. 14, 2005  (KR) .................... 10-2005-0085839
Sep. 15, 2005  (KR) .................... 10-2005-0085986
Sep. 15, 2005  (KR) .................... 10-2005-0085987

(51) Int. Cl.
    *H04R 25/00*    (2006.01)

(52) U.S. Cl. ........ 381/174; 381/175; 381/189; 381/190; 381/191

(58) Field of Classification Search .......... 381/170–179, 381/189, 356, 357, 369; 29/25.35, 25.41, 29/592.1, 609.1, 886
See application file for complete search history.

(56) References Cited

U.S. PATENT DOCUMENTS 6,781,231 B2 *  8/2004  Minervini .................... 257/704
7,202,552 B2 *  4/2007  Zhe et al. .................... 257/659
2004/0252858 A1 * 12/2004  Boor et al. .................... 381/369

* cited by examiner

*Primary Examiner* — Davetta W Goins
*Assistant Examiner* — Matthew Eason
(74) *Attorney, Agent, or Firm* — Ladas & Parry LLP

(57) ABSTRACT

Disclosed is a silicone based condenser microphone comprising: a metal case which includes a sound hole, a board which is mounted with a MEMS microphone chip and an ASIC chip having an electric voltage pump and a buffer IC and is formed with a connecting pattern for joining with the metal case. A fixing material for fixing the metal case to the board, and an adhesive for applying to the whole part where the metal case fixed to the board by the fixing material is joined with the board to bond the metal case to the board. Therefore, the metal case is tack-welded to the board by a laser to fix the case to the board and then the case is bonded to the board with the adhesive, thereby decreasing an inferiority ratio and strengthening a joining force and thus enhancing a mechanical firmness and highly resisting noise from the outside.

19 Claims, 13 Drawing Sheets

CONDENSER MICROPHONE AND PACKAGING METHOD FOR THE SAME

TECHNICAL FIELD

The present invention relates to a condenser microphone, and, more particularly to, a method for packaging a condenser microphone by joining a case of the microphone with a printed circuit board (PCB), and a condenser microphone packaged by the method.

BACKGROUND

Generally, a condenser microphone which has been widely used in mobile equipment or audio equipment consists of a voltage bias element, a diaphragm and back plate pair for forming a capacitor which is changed corresponding to a sound pressure, and a JFET for buffering an output signal. This typical condenser microphone consists of an assembly which is integrally assembled by sequentially inserting a diaphragm, a spacer ring, an insulating ring, a back plate and a conductive ring into a case and then bending an end of the case toward a PCB side after inserting the PCB which is mounted with circuit parts.

Meanwhile, recently, a semiconductor fabricating technology using a micromachining technology has been introduced for an integrated micro device. According to this technology which is called MEMS (Micro Electro Mechanical System), a sensor, an actuator and an electro mechanical structure can be fabricated in a μm unit using a micromachining technology which applies a semiconductor fabricating process, especially, an integrated circuit technology. A MEMS chip microphone manufactured by the micromachining technology has merits that miniaturization, high-performance, multifunction and integration can be obtained through the high precise micromachining technology and safety and reliability can be enhanced.

However, since the MEMS chip microphone manufactured by the micromachining technology performs electrical driving and signal processing, it is required to package the microphone with another special purpose semiconductor chip device, that is, an ASIC (Application Specific Integrated Circuit).

A conventional technology for packaging a MEMS chip microphone is disclosed in U.S. Pat. No. 6,781,231 published Aug. 25, 2004 and entitled "Micro Electro Mechanical System Package with Environmental and Interference Shield". The above package has a structure for adhering a cover which consists of an internal conductive layer and an external conductive layer on a multi-layered substrate which is alternately overlapped by a conductive layer and a non conductive layer using a conductive adhesive.

Thus, the conventional packaging method has problems in that a manufacturing cost is raised and a bonding property is deteriorated due to a complex process, and the method is sensitive to external noise such as an electromagnetic noise and the like since a non conductive material unlike a metal housing is used.

SUMMARY

It is, therefore, an object of the present invention to provide a method for packaging a condenser microphone by joining a case of the microphone with a board, and a condenser microphone packaged by the method.

It is another object of the invention to provide a method for packaging a condenser microphone by fixing a case of the microphone to the board to prevent the movement of the case when joining the case and the board by an adhesive and then bonding them with the adhesive, and a condenser microphone packaged by the method.

It is another object to provide a silicone based condenser microphone for preventing inferiority generation and increasing a bonding strength, which has a high resistance to external noise such as electromagnetic noise, by provisional spot welding an end of a metal case to a board which is mounted with MEMS microphone parts and then bonding them with an adhesive, and a packaging method for the silicone based condenser microphone.

According to one aspect of the present invention, there is provided a silicone based condenser microphone comprising: a metal case which is a sound hole: a board which is mounted with a MEMS microphone chip and an ASIC chip having a electric voltage pump and a buffer IC and is formed with a connecting pattern for joining with the metal case; a fixing means for fixing the metal case to the board; and an adhesive for applying to the whole part where the metal case fixed to the board by the fixing means is joined with the board to bond the metal case to the board.

Further, according to another aspect of the present invention, there is provided a method for packaging a silicone based condenser microphone. The method comprises the steps of: inputting a board which is mounted with a MEMS chip and an ASIC chip and is formed with a connecting pattern; inputting a metal case; aligning the metal case on the connecting pattern of the board; fixing the metal case to the connecting pattern of the board by provisional spot welding; bonding the whole part where the metal case fixed to the board is joined with the board with an adhesive; and curing the adhesive.

DESCRIPTION OF DRAWINGS

The above and other objects and features of the invention will become apparent from the following description of preferred embodiments taken in conjunction with the accompanying drawings, in which.

DETAILED DESCRIPTION OF PREFERRED EMBODIMENTS

Hereinafter, preferred embodiments of the present invention will be explained in detail with reference to the appended drawings.

A first embodiment is example wherein a case is formed with a sound hole for collecting sound and a number of modifications of the first embodiment will be shown in order. A second embodiment is an example wherein a microphone board is formed with a sound hole for collecting sound and a number of modifications of the second embodiment will be shown in order. A third embodiment is an example wherein a microphone board is formed with a sound hole and an inserting hole is formed with a main PCB and a number of modifications of the first embodiment will be shown in order.

Embodiment 1

Modification 1 of Embodiment 1

Figure 1:
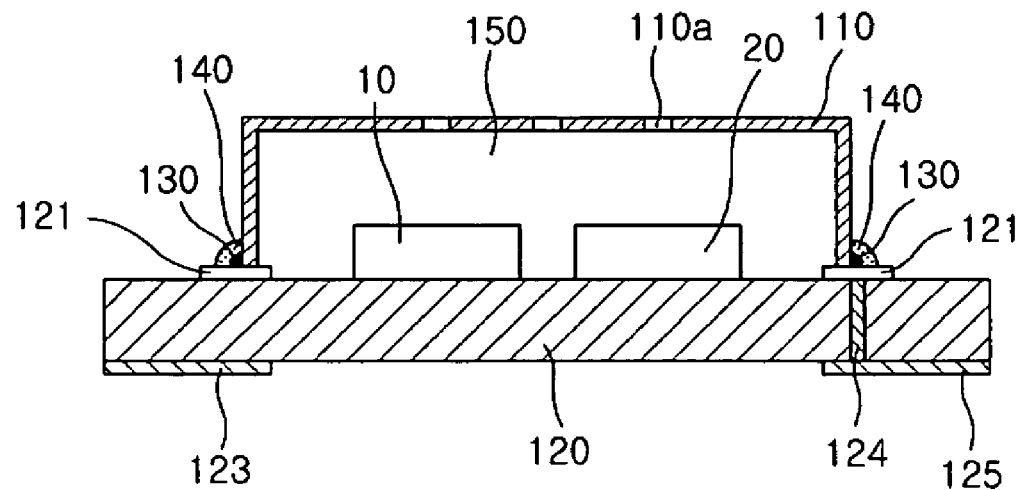
FIG. 1 is a sectional side view of a first modification of a first embodiment according to the present invention.
Figure 2:
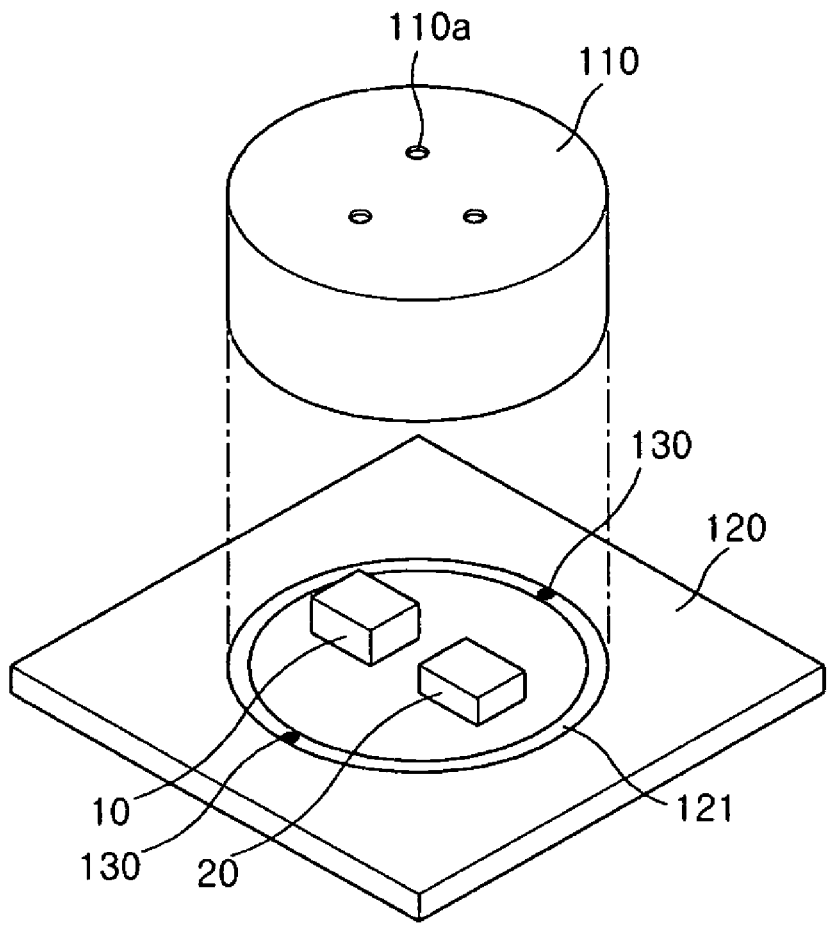
FIG. 2 is an exploded perspective view of a first modification of a first embodiment according to the present invention.
Figure 3:
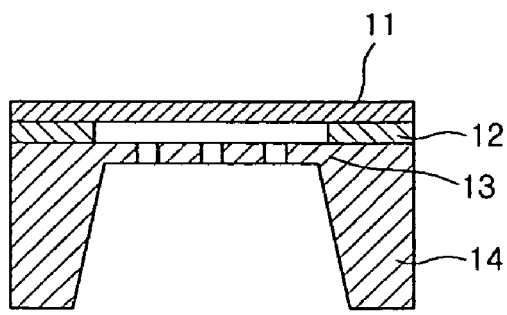
FIG. 3 is a view showing an example of a structure for a MEMS chip of a silicone based condenser microphone applied to each embodiment of the present invention.
Figure 4:
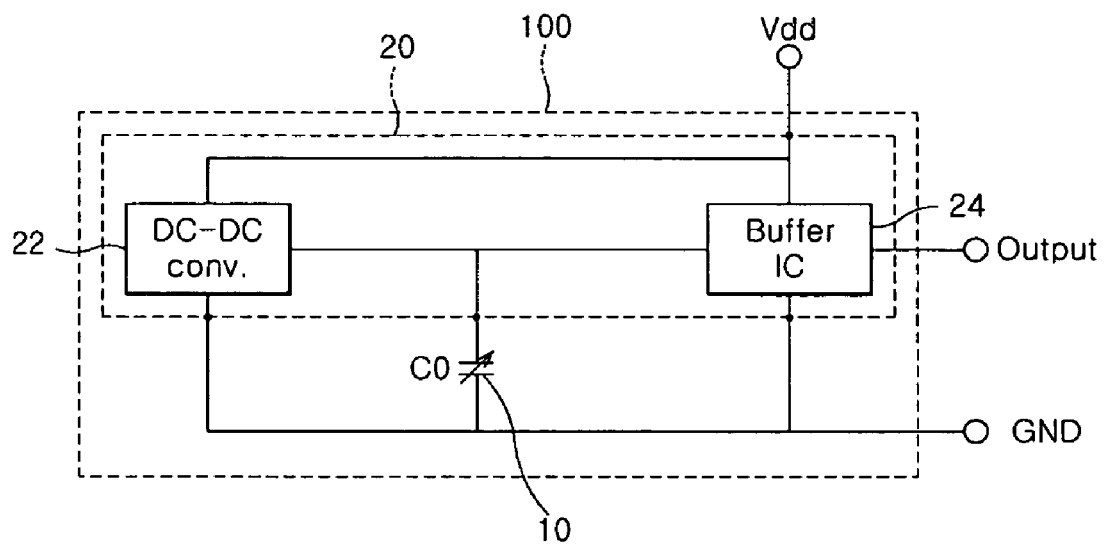
FIG. 4 is a circuit diagram of a silicone based condenser microphone applied to each embodiment of the present invention in common.

FIG. 1 is a sectional side view of a first modification of a first embodiment according to the present invention, FIG. 2 is an exploded perspective view of a first modification of a first embodiment according to the present invention, FIG. 3 is a view showing an example of a structure for a MEMS chip of a silicone based condenser microphone according to the present invention, and FIG. 4 is a circuit diagram of a silicone based condenser microphone according to the present invention.

According to a first modification of a first embodiment, as shown in FIGS. 1 and 2, a cylindrical metal case 110 is tack-welded to a PCB 120 which is mounted with a MEMS chip 10 and an ASIC chip 20 by a laser and then the case 110 and the PCB 120 are bonded with an adhesive 140. Here, the adhesive 140 is any one selected from the group of conductive epoxy, nonconductive epoxy, silver paste, silicone, urethane, acryl and cream solder.

Referring to FIGS. 1 and 2, the PCB 120 is mounted with the MEMS chip 10 and the ASIC chip 20 and is formed with a circular connecting pattern 121 on its portion which contacts the metal case 110. Meanwhile, although there is not shown in the drawing, if necessary, the PCB may be mounted with a capacitor or a resistor for shielding electromagnetic noise or ESD.

Since the PCB 120 is broader than the metal case 110, connecting pads or connecting terminals for connecting with an external device can be freely disposed on the broad PCB. The connecting pattern 121 is formed by forming a copper clad through a general PCB manufacturing process and then plating the copper clad with Ni or Au. Here, the board 120 may be a PCB, a ceramic board, a flexible PCB (FPCB) or a metal PCB.

The metal case 110 has a cylindrical shape having an opening which faces the PCB 120 to receive the chip parts therein, wherein an upper surface thereof is formed with a sound hole 110a for collecting sound. The metal case 110 is made of any one selected from the group of brass, copper, stainless steel, aluminum, nickel alloy and the like. Further, the metal case 110 is plated with Au or Ag. The metal case 110 may have various shapes such as a circle, a square and the like.

The metal case 110 is aligned on the connecting pattern 121 of the PCB 120 and then the provisional spot welding point of a connecting portion therebetween is partially tack-welded by a laser (not shown) to temporarily fix the case 110 to the board 120. Then, the adhesive 140 is evenly applied on the whole connecting portion between the case and the board, whereby microphone packaging is finished. Here, the 'provisional spot welding' does not mean welding for a whole connecting portion between the case 110 and the PCB 120, but means spot welding for one or more connecting points (that is, provisional spot welding points, preferably, two to four points) therebetween so that the case 110 is fixed to the PCB 120. As such, a joining point which is formed between the case 110 and the PCB 120 by the provisional spot welding is called a provisional spot welding point 130. The case 110 is fixed to the PCB 120 through the provisional spot welding point 130. Thus, since the case 110 is not moved when the case 110 is adhered to the PCB 120 by the adhesive 140 or upon a curing process, joining of the case 110 and the PCB 120 can be performed in a correct position. Here, the connecting pattern 121 is connected with a ground terminal 125, wherein, if the metal case 110 is adhered to the connecting pattern 121, there is a merit that it is easy to eliminate noise by interrupting noise from the outside.

According to the microphone assembly packaged as described above, the metal case 110, as shown in FIG. 1, is fixed to the connecting pattern 121 of the PCB 120 by provisional spot welding of the laser, wherein a space 150 between the metal case 110 and the PCB 120 is served as a sound chamber.

Further, the PCB 120 is formed with connecting terminals 123 and 125 for connecting with the external device on a bottom surface thereof, wherein the number of the connecting terminals 123 and 125 may be two to eight. Each of the connecting terminals 123 and 125 is electrically connected through a through-hole 124 to a chip part surface of the PCB.

In one embodiment of the present invention, if extending the connecting terminals 123 and 125 to a circumference of the PCB 120, an electric soldering iron can easily access the exposed surface of the terminals, whereby a rework operation can be easily performed.

The MEMS chip 10, as shown in FIG. 3, has a structure that a back plate 13 is formed on a silicone wafer 14 by using a MEMS technology and then a diaphragm 11 is formed to face the back plate 13 with a spacer 12 interposed between the diaphragm 11 and the back plate 13. Since this fabricating technology of the MEMS chip 10 has been explained, further explanation will be omitted.

The ASIC chip 20 which is connected with the MEMS chip 10 to process electrical signals, as shown in FIG. 4, includes an electric voltage pump 22 for supplying an electric pressure to allow the MEMS chip 10 to be operated as a condenser microphone, and a buffer IC 24 for amplifying an electric sound signal sensed through the MEMS chip 10 or performing impendence matching of the sensed electric sound signal, thereby supplying the processed signal through the connecting terminal to the outside. Here, the electric voltage pump 22 may be a DC-DC converter, and the buffer IC 24 may use an analogue amplifier or an ADC. Referring to FIG. 4, a condenser symbol "CO" indicates an electrical equilibrium circuit for the MEMS chip 10. Here, the MEMS microphone package 100 is connected through three connecting terminals (Vdd, GND, Output) to the external device.

According to the embodiment of the present invention, the provisional spot welding for fixing the case 110 to the PCB 120 is performed by laser welding. However, the provisional spot welding may be performed by another method, for example, soldering or punching. Further, the adhesive 140 may use any of conductive or nonconductive epoxy series, silver paste, silicone, urethane, acryl, cream solder and the like.

[Packaging Method]

Figure 5:
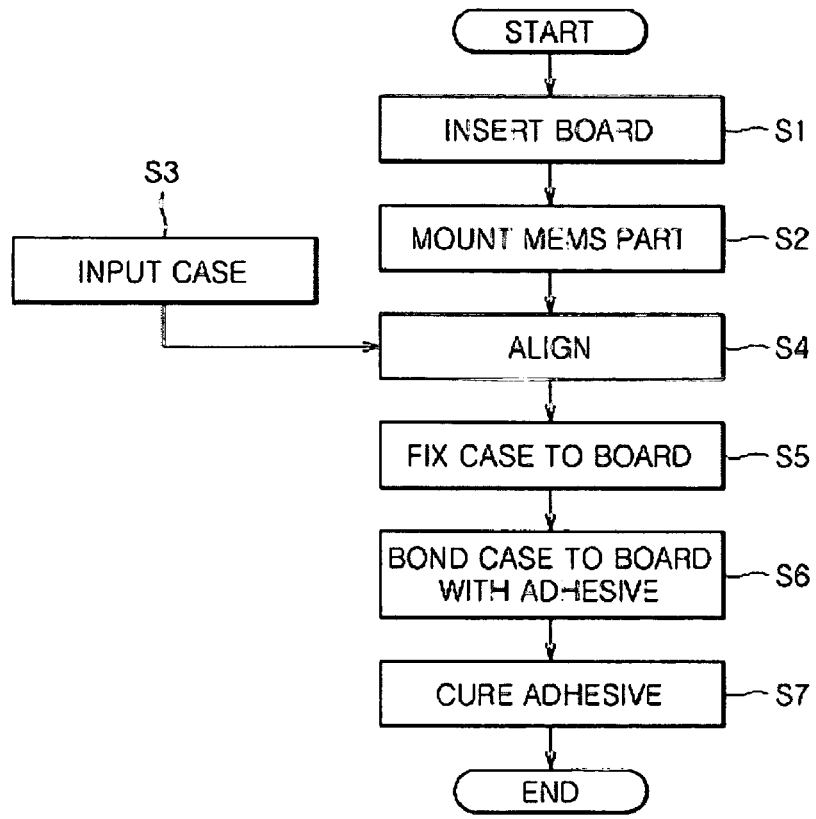
FIG. 5 is a flow chart showing a packaging process of a silicone based condenser microphone according to the present invention.

FIG. 5 is a flow chart showing a packaging process of a silicone based condenser microphone according to the present invention.

A method for packaging a silicone based condenser microphone according to the present invention, as shown in FIG. 5, includes the steps of inputting the board (S1), mounting the MEMS part 10 and the ASIC chip 20 on the board 120 (S2), inputting the metal case (S3), aligning the case 110 on the connecting pattern 121 of the board 120 (S4), fixing the end of the case 110 to the connecting pattern 121 of the board by the provisional spot welding (S5), applying the adhesive 140 to the whole part where the case 110 meets the board 120 to bond the case 110 and the board 120 after fixing the case 110 to the board 120 (S6), and curing the adhesive 140 (S7).

Here, the board 120 may be a PCB, a ceramic board, a FPCB or a metal PCB. The board 120 is formed with the connecting pattern 121 for connecting with the metal case 110.

The metal case 110 is made of any one selected from the group of brass, copper, stainless steel, aluminum, nickel alloy and the like. Further, the metal case 110 may be plated with Au or Ag. The metal case 110 may have various shapes such as a circle, a square and the like.

Further, in the step S5 of fixing the metal case 110 to the board 120, the provisional spot welding may be performed by laser welding or soldering. Further, the fixing operation may be performed by punching and the like. The adhesive 140 may use conductive or nonconductive epoxy series. After bonding the case 110 and the board 120 with the adhesive, the adhesive is cured by any of natural curing, ultraviolet curing, heat curing and the like to finish the manufacturing of the microphone.

According to the packaging method of the present invention, the metal case 110 is tack-welded to the board 120 by the laser to fix the case 110 to the board 120 and then the case 110 is adhered to the board 120 with the adhesive 140 and finally the adhesive 140 is cured, whereby a joining force (that is, an electrical connecting force and a sealing performance) is strengthened. As a result, a sound quality is enhanced, and the microphone has a high-resistance to noise from the outside. Specially, the defect occurrence ratio is decreased and a process expense is saved, thereby sharply cutting a total manufacturing cost.

Modification 2 of Embodiment 1

Figure 6:
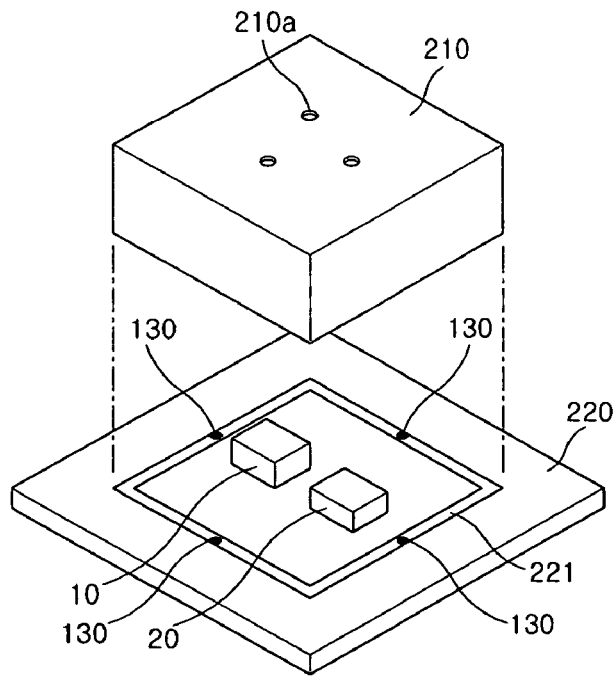
FIG. 6 is an exploded perspective view of a second modification of a first embodiment according to the present invention.

FIG. 6 is an exploded perspective view of a second modification of a first embodiment according to the present invention, wherein a rectangular parallelepiped shaped metal case 210 is tack-welded to a PCB 220 by a laser to fix the case to the PCB and then the case is adhered to the PCB with an adhesive and finally the adhesive is cured.

Referring to FIG. 6, the PCB 220 is mounted with the MEMS chip 10 and the ASIC chip 20 and is formed with a rectangular connecting pattern 221 on its portion which contacts the metal case 210. The connecting pattern 221 is made of a copper clad film through a general PCB pattern forming technology.

The metal case 210 has a rectangular parallelepiped shape having an opening which faces the PCB 220, wherein an upper surface thereof is formed with a sound hole 212 for collecting sound.

The metal case 210 is aligned on the connecting pattern 221 of the PCB 220 and then a provisional spot welding point 130, as shown in FIG. 6, is formed by welding one connecting point of each portion of the connecting pattern 221 using a laser (not shown). Then, the adhesive 140 is evenly applied on the whole connecting part between the case and the board and then is cured to finish microphone packaging. Here, the connecting pattern 221 is connected with a ground terminal, wherein, if the metal case 210 is welded to the connecting pattern 221, there is a merit that it is easy to eliminate noise itself by interrupting noise collected from the outside.

Since a microphone assembly which is packaged as described above has the same structure as the assembly shown in FIG. 1, the further explanation will be omitted to avoid repetition.

Modification 3 of Embodiment 1

Figure 7:
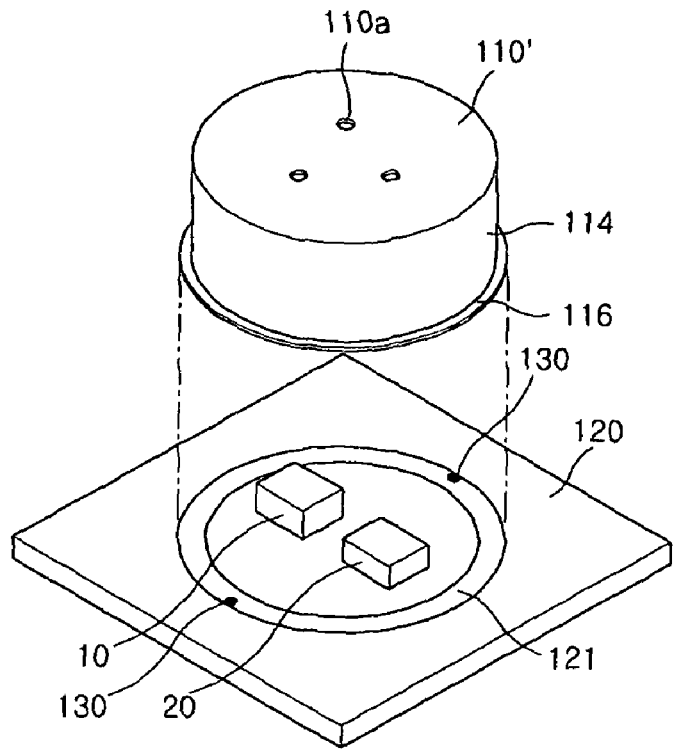
FIG. 7 is an exploded perspective view of a third modification of a first embodiment according to the present invention.

FIG. 7 is an exploded perspective view of a third modification of a first embodiment according to the present invention, wherein a cylindrical metal case 110 which is formed with a skirt 116 projected in a shape of "L" from an end of the case is tack-welded to a PCB 120 by a laser to fix the case to the PCB and then the case is bonded to the PCB with an adhesive and finally the adhesive is cured.

Referring to FIG. 7, the PCB 120 is mounted with the MEMS chip 10 and the ASIC chip 20 and is formed with a circular connecting pattern 121 on its portion which contacts the metal case 110'. Since the PCB 120 is broader than the metal case, connecting pads or connecting terminals for connecting with an external device can be freely disposed on the broad PCB. Preferably, the connecting pattern 121 is formed by forming a copper clad through a general PCB manufacturing process and then plating the copper clad with Ni or Au.

Further, preferably, the width of the connecting pattern 121 according to the third embodiment is wider than that of the connecting pattern of the first embodiment to correspond to the skirt 116 of the metal case.

The metal case 110' has a cylinder shape having an opening which faces the PCB 120, wherein an upper surface thereof is formed with a sound hole 110a for collecting sound. The case body 114 is formed with the skirt 116 projected outwardly on the end thereof.

The skirt 116 of the metal case 110' is aligned on the connecting pattern 121 of the PCB 120 and then the case 110' is tack-welded to the board 120 using a laser (not shown) to fix the case to the board. Then, the case 110 is adhered to the board 120 with the adhesive 140 to finish microphone packaging.

Modification 4 of Embodiment 1

Figure 8:
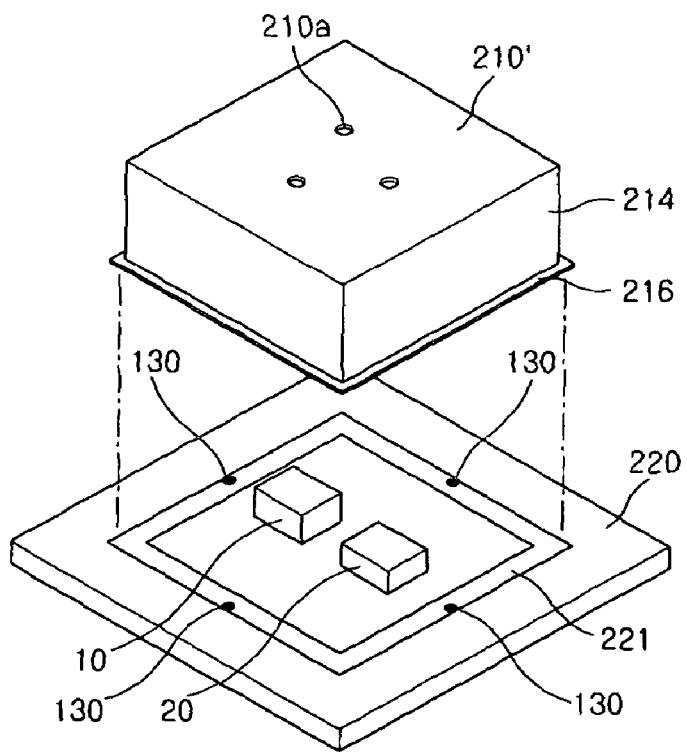
FIG. 8 is an exploded perspective view of a fourth modification of a first embodiment according to the present invention.

FIG. 8 is an exploded perspective view of a fourth modification of a first embodiment according to the present invention, wherein a rectangular parallelepiped shaped metal case 210' which is formed with a skirt 216 projected in a shape of "L" from an end of the case is tack-welded to a PCB 220 by a laser to fix the case to the PCB and then the case is bonded to the PCB with an adhesive 140 and finally the adhesive is cured.

Referring to FIG. 8, the PCB 220 is mounted with the MEMS chip 10 and the ASIC chip 20 and is formed with a rectangular connecting pattern 221 on its portion which contacts the metal case 210'. Since the PCB 220 is broader than the metal case 210' connecting pads or connecting terminals for connecting with an external device can be freely disposed on the broad PCB. Preferably, the connecting pattern 221 is formed by forming a copper clad through a PCB manufacturing process and then plating the copper clad with Ni or Au. Preferably, the width of the connecting pattern 221 according to the fourth embodiment is wider than that of the connecting pattern of the second embodiment to correspond to the skirt 216 of a body 214 of the metal case 210'.

The metal case 210' has a rectangular parallelepiped shape having an opening which faces the PCB 220, wherein an upper surface thereof is formed with a sound hole 210a for collecting sound. A case body 214 is formed with the skirt 216 projected outwardly on the end thereof.

The skirt 216 of the metal case 210' is aligned on the connecting pattern 221 of the PCB 220 and then the case 210 is tack-welded to the board 220 using a laser (not shown) to fix the case to the board. Then, the case 210' is adhered to the board 220 with the adhesive 140 to finish microphone packaging.

Modification 5 of Embodiment 1

Figure 9:
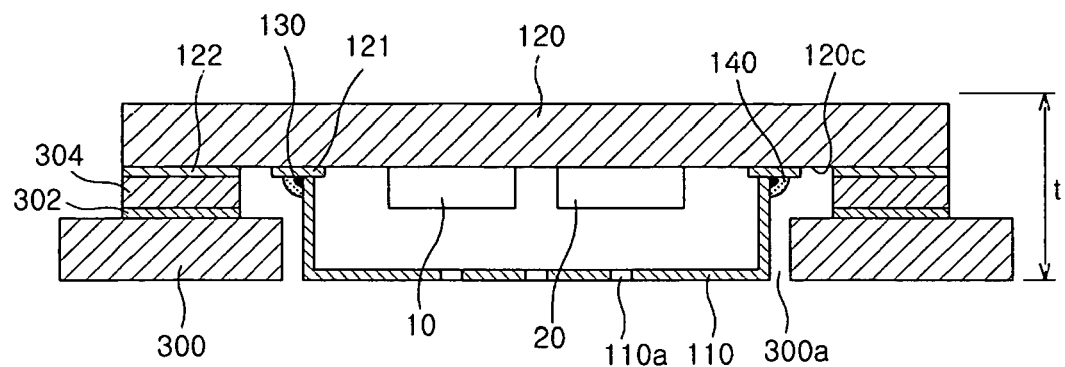
FIG. 9 is a sectional side view of a fifth modification of a first embodiment according to the present invention.

FIG. 9 is a sectional side view of a fifth modification of a first embodiment according to the present invention.

According to the silicone based condenser microphone of the fifth modification of a first embodiment of the present invention, a cylindrical metal case 110 is fixed to a board 120 which is broader than the case by provisional spot welding and then the case is bonded to the board with an adhesive. The board is formed with connecting terminals 122 which are connected with connecting pads 302 of a main PCB 300 of a product having the microphone on a part side 120 thereof. In the fifth modification of the present invention, four connecting terminals are provided, but the number is merely an example. That is, two to eight connecting terminals may be provided. The reference number 130 indicates a provisional spot welding point. Further, if extending the connecting terminals 122 to a circumference of the board or the reverse side of the part side, heat transfer of an electric soldering iron is improved, whereby a rework operation can be more convenient.

The main PCB 300 of the product where the silicone based condenser microphone according to the fifth modification of the present invention is mounted and is formed with a circular inserting hole 300a for mounting the case 110 of the silicone based condenser microphone and connecting pads 302 corresponding to the connecting terminals 122 are formed on the board 120 of the microphone.

As such, according to a structure of FIG. 9 showing that the silicone based condenser microphone is mounted on the main PCB 300, the metal case 110 projected from the central portion of the part side 120c of the board is inserted, the inserting hole 300a of the main PCB 300, and the connecting pads 302 of the main PCB and the connecting terminals 122 of the microphone are connected by a solder 304.

Thus, according to a mounting method of the present invention, since the case 110 projected from the board of the microphone is inserted into the inserting hole 300a of the main PCB 300, a total height t of an assembly according to the present invention is lower than that of an assembly assembled when the conventional microphone having the board which is formed with the connecting terminals on the reverse side of the part side thereof, thereby efficiently saving space for mounting a part of the product.

Referring again to FIG. 9, the board 120 is mounted with the MEMS chip 10 and the ASIC chip 20 within the metal case of the silicone based condenser microphone and is formed with a circular connecting pattern 121 on its portion which contacts the metal case 110.

Here, the board 120 may be selected from among a PCB, a ceramic board, a FPCB, a metal PCB and the like. The metal case is formed with a sound hole 110a for collecting sound. The metal case is made of any one selected from the group of brass, copper, stainless steel, aluminum, nickel alloy and the like. Further, the metal case may be plated with Au or Ag.

Further, as shown in FIG. 9, if extending the connecting terminal 122 through the circumferential part to the reverse side of the part side, a heat transfer of an electric soldering iron is improved, whereby a rework operation can be more easily performed. Meanwhile, although there is not shown in the drawing, the connecting terminal 122 may be extended up to the circumferential part of the board.

Embodiment 2

Modification 1 of Embodiment 2

Figure 10:
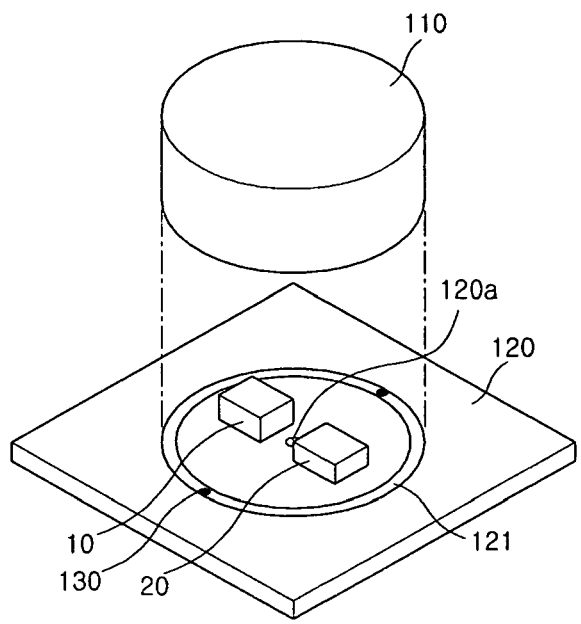
FIG. 10 is a sectional side view of a first modification of a second embodiment according to the present invention.
Figure 11:
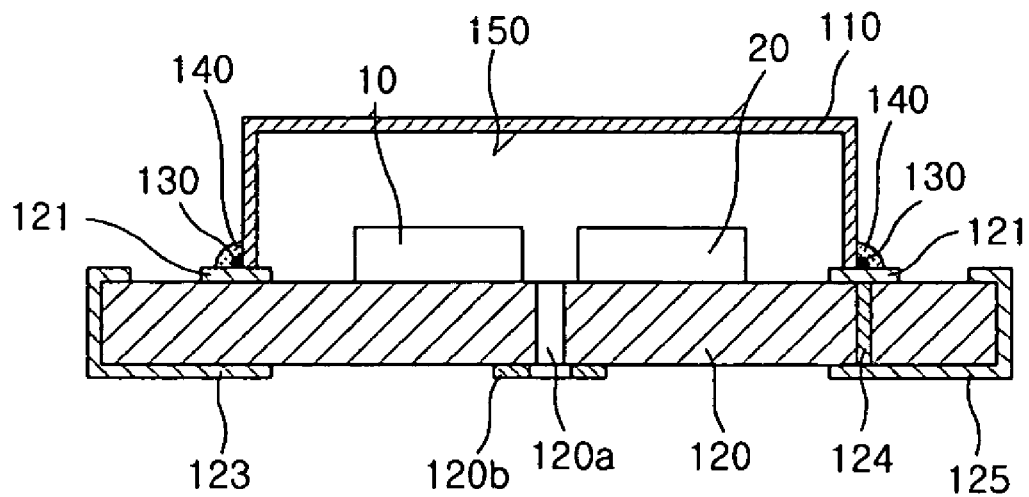
FIG. 11 is a sectional side view of a second modification of a second embodiment according to the present invention.

FIG. 10 is an exploded perspective view of a first modification of a second embodiment of a silicone based condenser microphone according to the present invention, wherein the microphone has a board which is formed with a sound hole, and FIG. 11 is a sectional side view of the silicone based condenser microphone shown in FIG. 10.

According to a first modification of a second embodiment according to the present invention, as shown in FIGS. 10 and 11, a cylindrical metal case 110 having a closed upper side is tack-welded to a connecting pattern 121 of a PCB 120 which is mounted with a MEMS chip 10 and an ASIC chip 20 and is formed with a sound hole 120a by a laser to fix the metal case 110 to the board 120 and then the connecting part between the case 110 and the PCB 120 is wholly bonded with an adhesive 140. Here, the adhesive 140 is any one selected from the group of conductive epoxy, nonconductive epoxy, silver paste, silicone, urethane, acryl and cream solder.

Referring to FIGS. 10 and 11, the PCB 120 is formed with a sound hole 120a for collecting an external sound near the center thereof and is mounted with the MEMS chip 10 and the ASIC chip 20 around the center thereof. Further, the PCB is formed with a circular connecting pattern 121 on its portion which contacts the metal case 110. Meanwhile, although not shown in the drawing, if necessary, the board may be mounted with a capacitor or a resistor for shielding electromagnetic noise or ESD.

Since the PCB 120 is broader than the metal case 110, connecting pads or connecting terminals for connecting with an external device can be freely disposed on the broad PCB. The connecting pattern 121 is formed by forming a copper clad through a PCB manufacturing process and then plating with Ni or Au. Here, the board 120 may be a PCB, a ceramic board, a FPCB or a metal PCB.

The metal case 110 has a cylindrical shape having a closed side and an opened side which faces the PCB 120 to receive the chip parts therein. Since the metal case has a structure for collecting sound form the outside through the sound hole 120a of the board, the bottom side of the metal case is closed. The metal case is made of any one selected from the group of brass, copper, stainless steel, aluminum, nickel alloy and the like. Further, the metal case may be plated with Au or Ag. The metal case may have various shapes such as a circle, a square and the like.

The metal case 110 is aligned on the connecting pattern 121 of the PCB 120 and then the provisional spot welding point 130 is tack-welded by a laser (not shown) to fix the case 110 to the board 120. As such, a joining point which is formed between the case 110 and the PCB 120 by the provisional spot welding is called the provisional spot welding point 130. The case 110 is fixed to the PCB 120 through the provisional spot welding point 130. Thus, since the case 110 is not moved when the case 110 is adhered to the PCB 120 by the adhesive 140 or upon a curing process, the operation for joining the case 110 and the PCB 120 can be performed in a correct position. Here, the connecting pattern 121 is connected with a ground terminal 125, wherein, if the metal case 110 is adhered to the connecting pattern 121, there is a merit that it is easy to eliminate noise by interrupting noise from the outside.

According to the microphone assembly packaged as described above, the metal case 110, as shown in FIG. 11, is fixed to the connecting pattern 121 of the board 120 by provisional spot welding of the laser and then the metal case 110 and the board 120 are bonded with the adhesive 140, wherein a space 150 between the metal case 110 and the PCB 120 serves as a sound chamber.

Further, the board 120 is formed with the sound hole 120a for collecting the external sound, wherein the board 120 is formed with a sealing terminal 120b for sealing the sound hole 120a by soldering around the sound hole of a bottom surface of the PCB 120 to prevent distortion of a sound wave in the space between a main PCB 300 and the microphone. Here, the number of the connecting terminals 123 and 125 for connecting with the external device may be two to eight. Each of the connecting terminals 123 and 125 may be electrically connected through through-hole 124 to a chip part surface of the PCB 120. According to this embodiment of the present invention, extending the connecting terminals 123 and 125 to a circumference of the PCB 120, an electric soldering iron can approach to an exposed surface of the terminal, whereby a rework operation can be easily performed.

Figure 15:
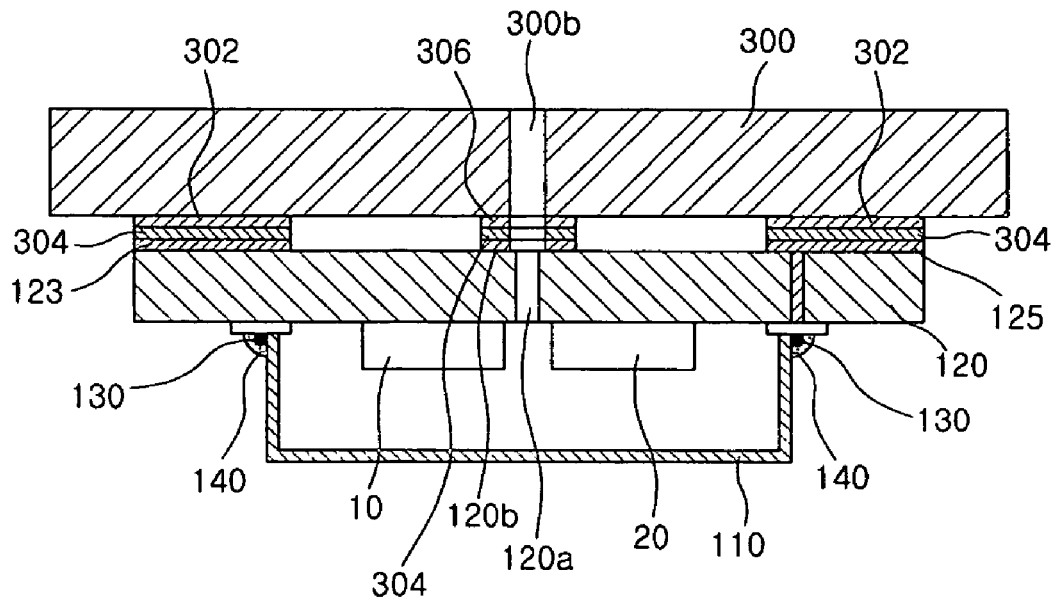
FIG. 15 is a sectional side view showing an example of mounting a silicone condenser microphone where a sound hole is formed with a PCB thereof in a main PCB.

An example showing that the microphone according to the present invention is mounted on the main PCB 300 is illustrated in FIG. 15.

Referring to FIG. 15, the main PCB 300 where the microphone is mounted is formed with a main sound hole 300b for collecting the external sound, wherein the main PCB is formed with a sealing terminal 306 for sealing the main sound hole 300b by soldering around the main sound hole thereof to prevent distortion of a sound wave in the space between a main PCB 300 and the microphone. Further, the main PCB 300 is formed with connecting pads 302 corresponding to the connecting terminals 123 and 125 of the microphone. If connecting the microphone according to the present invention with the main PCB 300 by a solder 304, the external sound is collected through the main sound hole 300b of the main PCB 300 and then passes through an area sealed by the sealing terminal 306. Then, the external sound is collected through the sound hole 120a of the microphone PCB 120 to the inside of the microphone.

Figure 16:
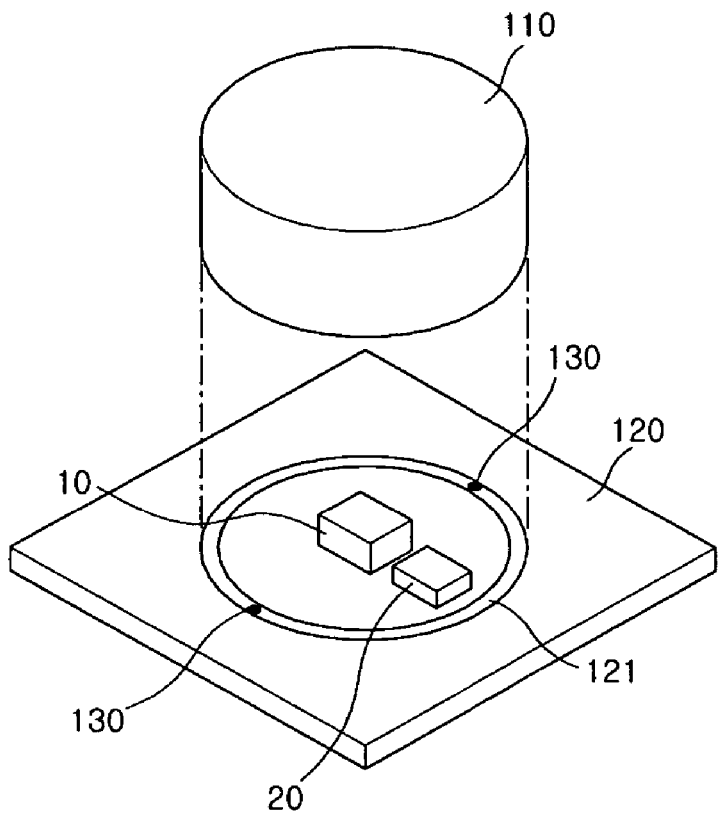
FIG. 16 is an exploded perspective view of another modification of a second embodiment, wherein a sound hole is formed with the position of PCB attached with a MEMS chip.
Figure 17:
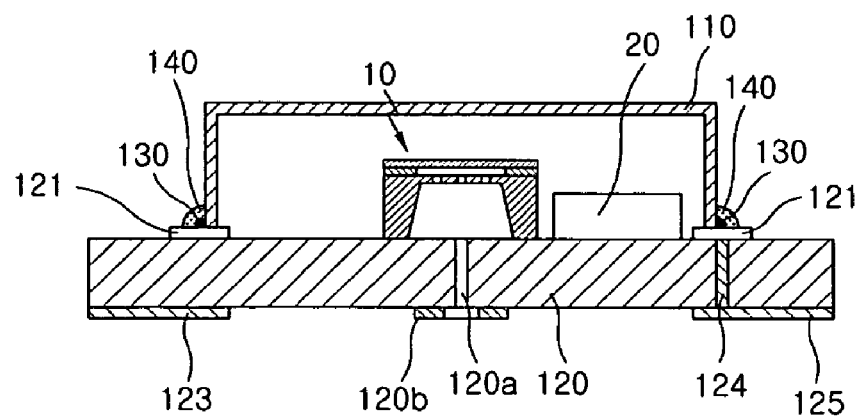
FIG. 17 is a sectional side view of another modification different from the modification of FIG. 16.

Meanwhile, according to the first modification in FIG. 10, the board is formed with the sound hole on a position where the parts are not mounted. However, according to an alternative example shown in FIGS. 16 and 17, the board may be formed with the sound hole 120a on the position where the MEMS chip 10 is mounted. In the alternative example in FIGS. 16 and 17, the external sound collected into the sound hole 120a of the board directly passes through the MEMS chip 10 to vibrate the diaphragm.

Modification 2 of Embodiment 2

Figure 12:
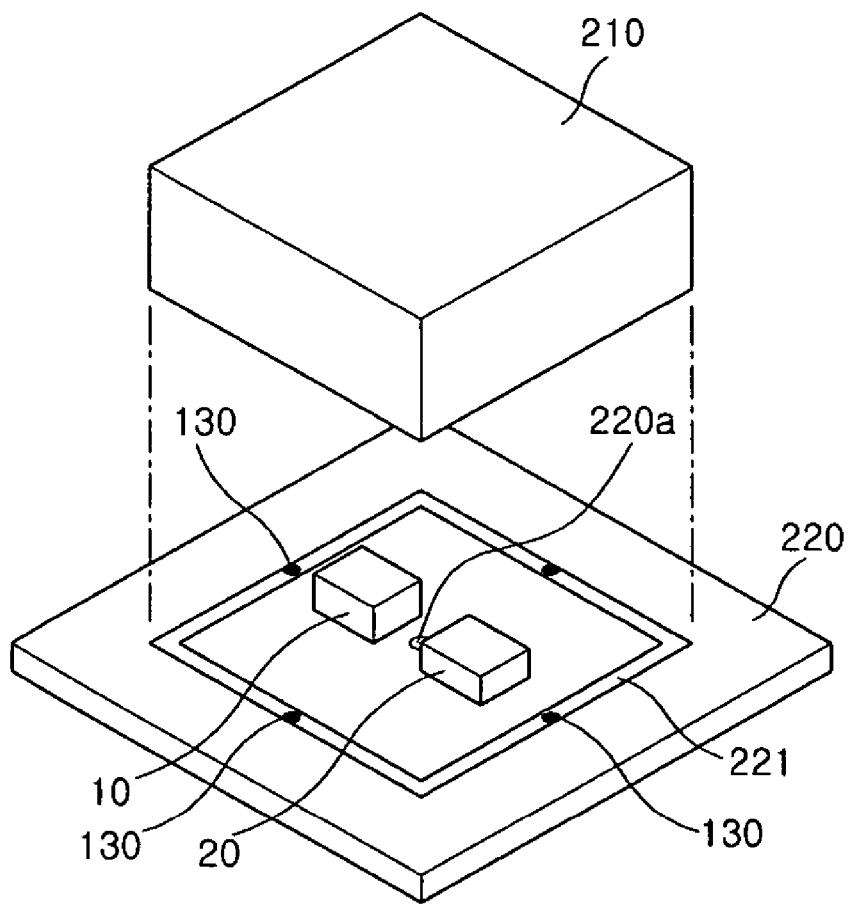
FIG. 12 is an exploded perspective view of a second modification of a second embodiment according to the present invention.

FIG. 12 is an exploded perspective view of a second modification of a second embodiment according to the present invention, wherein a rectangular parallelepiped shaped metal case 210 is tack-welded to a board 220 by a laser and then the case is adhered to the board 220 with an adhesive 140. According to the second modification of the second embodiment, the provisional spot welding is performed one by one on each edge of the square shaped case 210, thereby forming four provisional spot welding points 130.

Referring to FIG. 12, the PCB 220 is formed with a sound hole 220a for collecting an external sound and is mounted with the MEMS chip 10 and the ASIC chip 20 around the sound hole 220a. Further, the PCB is formed with a rectangular connecting pattern 221 on its portion which contacts the metal case 210. The connecting pattern 221 is formed of a copper clad film by a general PCB pattern forming technology. The board 220 is formed with a sealing terminal 120b (FIG. 11) for sealing the sound hole 220a by soldering around the sound hole 220a of a bottom surface of the PCB 220 to prevent distortion of a sound wave in a space between the main PCB 300 and the microphone.

The metal case 210 has a rectangular parallelepiped shape having an opening which faces the PCB 220, wherein, since the external sound is collected through the sound hole 220a of the board, the bottom surface of the case is closed.

The metal case 210 is aligned on the connecting pattern 221 of the board 220 and then the provisional spot welding point 130 is welded by a laser (not shown) to fix the case 210 to the board 220. Then, the adhesive 140 (FIG. 11) is applied to the whole circumference of the part where the case and the board are connected and then is cured, thereby finishing microphone packaging. Here, the connecting pattern 221 is connected with a ground terminal, wherein, if the metal case 210 is welded to the connecting pattern 221, there is a merit that it is easy to eliminate noise itself by interrupting noise collected from the outside.

Since a microphone assembly which is packaged as described above has the same structure as the assembly shown in FIG. 11, further explanation will be omitted to avoid repetition.

Modification 3 of Embodiment 2

Figure 13:
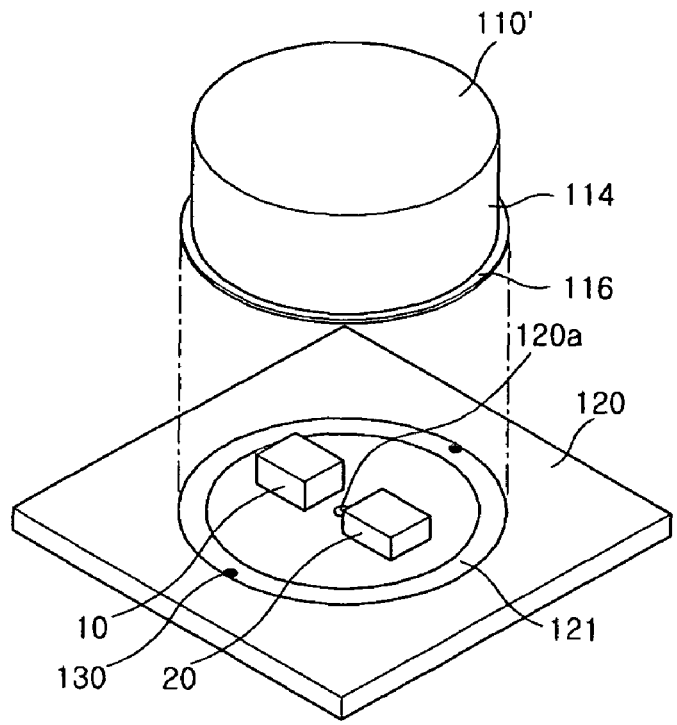
FIG. 13 is an exploded perspective view of a third modification of a second embodiment according to the present invention.

FIG. 13 is an exploded perspective view of a third modification of a second embodiment according to the present invention, wherein a cylindrical metal case 110 which is formed with a skirt 116 projected in a shape of "L" from an opened end of the case is tack-welded to a PCB 120 by a laser to fix the case to the PCB and then an adhesive 140 is applied to the whole circumference of the part where the case is connected with the PCB.

Referring to FIG. 13, the PCB 120 is formed with the sound hole 120a for collecting an external sound and is mounted with the MEMS chip 10 and the ASIC chip 20. Further, the PCB is formed with a circular connecting pattern 121 on its portion which contacts the metal case 110'. Although not shown in the drawing, the PCB 120 is formed with a sealing terminal 120b for solder-sealing the sound hole 120a around the sound hole 120a of a bottom surface of the PCB 120 to prevent distortion of a sound wave in a space between the main PCB 300 and the microphone. Since the board 120 is broader than the metal case 110', connecting pads or connecting terminals for connecting with an external device can be freely disposed on the broad PCB. Preferably, the connecting pattern is formed by forming a copper clad through a general PCB manufacturing process and then plating the copper clad with Ni or Au. Further, preferably, the width of the connecting pattern 121 according to the third modification is wider than that of the connecting pattern of the first modification to correspond to the skirt 116 of the metal case.

The metal case 110' of the third modification has a cylindrical shape having an opening which faces the PCB 120, wherein, since the external sound is collected through the sound hole 120a of the PCB, a bottom surface of the case is closed. Further, a body 114 of the case 110' is formed with the skirt 116 projected outwardly on the opened end thereof.

The skirt 116 of the metal case 110' is aligned on the connecting pattern 121 of the PCB 120 and then the case 110' is tack-welded to the board 120 using a laser (not shown) to fix the case to the board. Then, the case 110' is adhered to the board 120 with the adhesive 140 to finish microphone packaging.

Modification 4 of Embodiment 2

Figure 14:
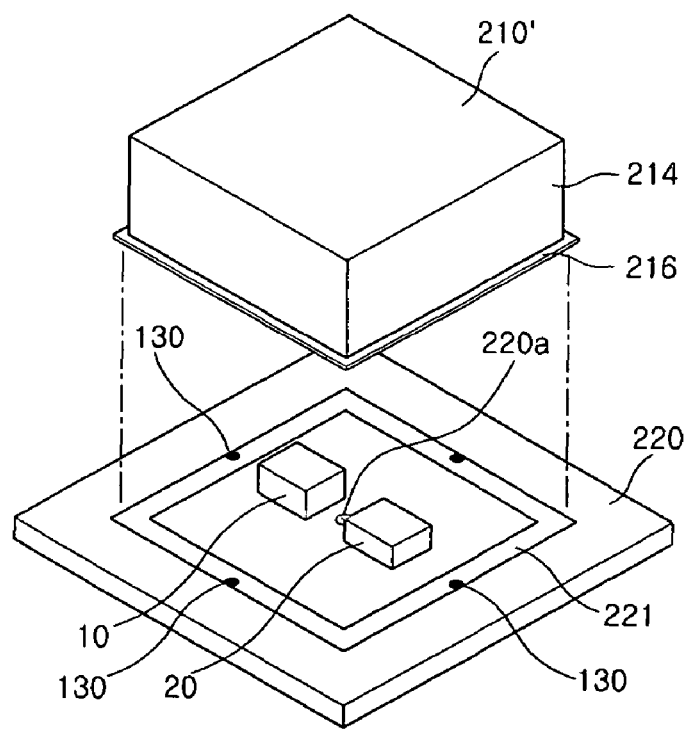
FIG. 14 is an exploded perspective view of a fourth modification of a second embodiment according to the present invention.

FIG. 14 is an exploded perspective view of a fourth modification of a second embodiment according to the present invention, wherein a rectangular parallelepiped shaped metal case 210' which is formed with a skirt 216 projected in a shape of an "L" from the opened end of the case is welded to a PCB 220 by a laser.

Referring to FIG. 14, the PCB 220 is formed with the sound hole 220a for collecting an external sound and is mounted with the MEMS chip 10 and the ASIC chip 20. Further, the PCB is formed with a rectangular connecting pattern 221 on its portion which contacts the metal case 210'. Although not shown in the drawing, the PCB 220 is formed with a sealing terminal for solder-sealing the sound hole around the sound hole 220a of a bottom surface of the PCB 220 to prevent distortion of a sound wave in a space between the main PCB 300 and the microphone.

Since the PCB 220 is broader than the metal case 210', connecting pads or connecting terminals for connecting with an external device can be freely disposed on the broad PCB. Preferably, the connecting pattern 221 is formed by forming a copper clad through a general PCB manufacturing process and then plating the copper clad with Ni or Au. Preferably, the width of the connecting pattern 221 according to the fourth embodiment is wider than that of the connecting pattern of the second embodiment to correspond to the skirt 216 of a body 214 of the metal case 210'.

The metal case 210' has a shape of a rectangular parallelepiped having an opening which faces the PCB 220, wherein, since the external sound is collected through the sound hole 220a of the PCB, a bottom surface of the case 210' is closed. Further, a body 214 of the case is formed with the skirt 216 projected outwardly on the opened end thereof.

The skirt 216 of the metal case is aligned on the connecting pattern 221 of the board 220 and then the provisional spot welding point 130 is welded by a laser (not shown) to fix the case 210' to the board 220. Then, the adhesive 140 is applied to the whole circumference of the part where the case meets the board and then is cured, thereby finishing microphone packaging.

Modification 5 of Embodiment 2

Figure 18:
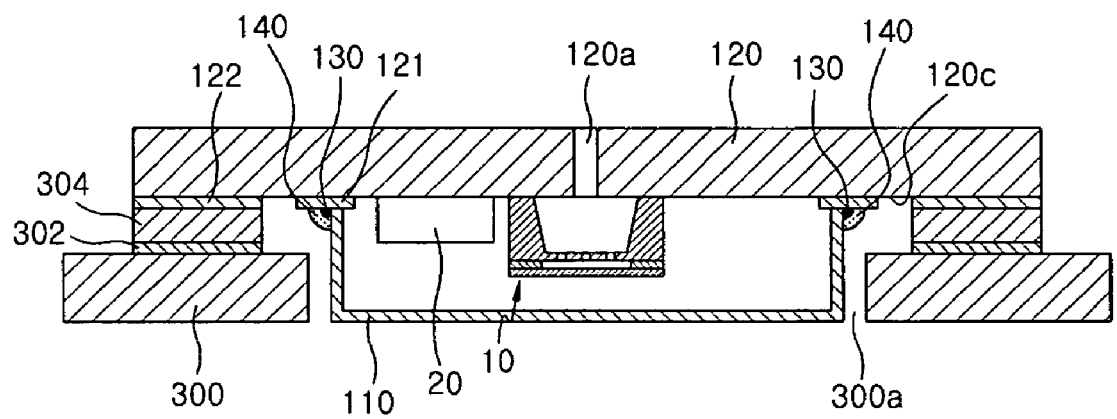
FIG. 18 is a sectional side view of a fifth modification of a second embodiment according to the present invention.

FIG. 18 is a sectional side view of a fifth modification of a second embodiment showing that connecting terminals are formed on a part side of a board and the board which is mounted with a MEMS chip is formed with a sound hole on its portion where the MEMS chip is positioned according to the present invention.

According to a silicone based condenser microphone, as shown in FIG. 18, a cylindrical metal case 110 having a bottom surface which is closed is attached to a board 120 which is broader than the metal case 110 and is formed with the sound hole 120a for collecting an external sound by adhesive 140, wherein the board is formed with connecting terminals 122 which are connected with connecting pads 302 of a main PCB 300 of a product having the microphone on a part side 120c thereof.

A main PCB 300 of the product having the silicone based condenser microphone of the present invention is formed with a circular inserting hole 300a for mounting the case 110 of the silicone based condenser microphone and is formed with the connecting pads 302 corresponding to the connecting terminals 122 which are formed on the board 120 of the microphone.

As such, according to a structure of FIG. 18 showing that the silicone based condenser microphone is mounted on the main PCB 300, the metal case 110 projected from the central portion of the part side 120c of the board is inserted the inserting hole 300a of the main PCB 300, and the connecting pads 302 of the main PCB and the connecting terminals 122 of the microphone are connected by a solder 304.

Thus, according to a mounting method of the present invention, since the case 110 projected from the board of the microphone is inserted into the inserting hole 300a of the main PCB 300, a total height t (as in FIG. 9) of an assembly according to the present invention is lower than that of an assembly assembled when the conventional microphone having the board which is formed with the connecting terminals on the reverse side of the part side thereof is mounted on the main PCB, thereby efficiently saving a space for mounting a part of the product.

Embodiment 3

Modification 1 of Embodiment 3

Figure 19:
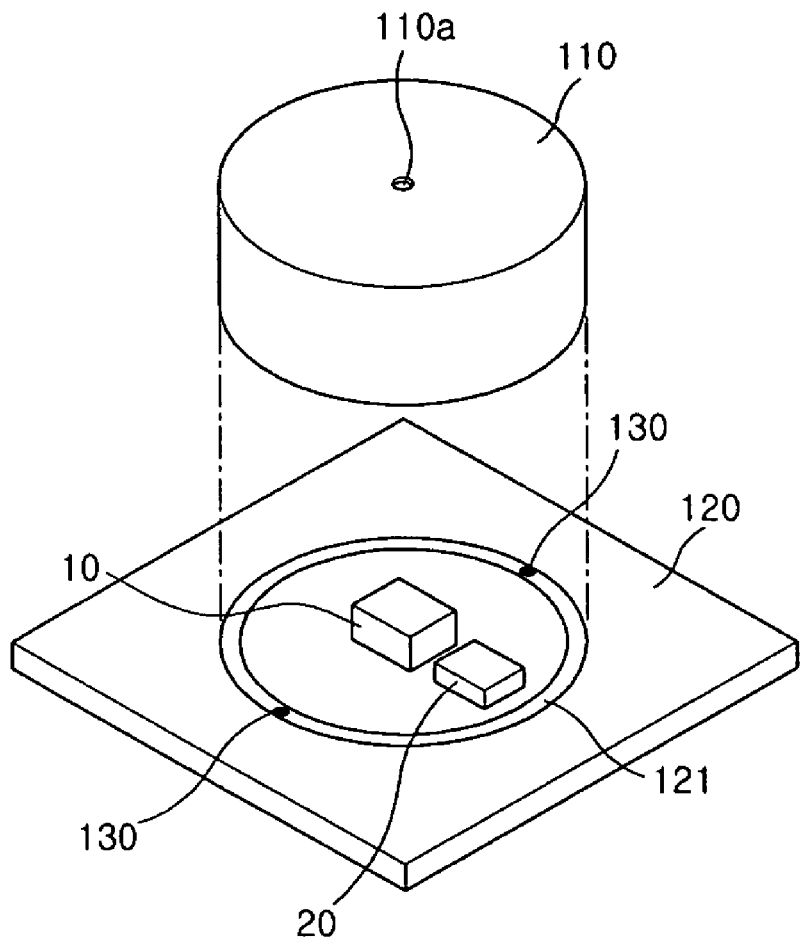
FIG. 19 is an exploded perspective view of a first modification of a third embodiment according to the present invention.
Figure 20:
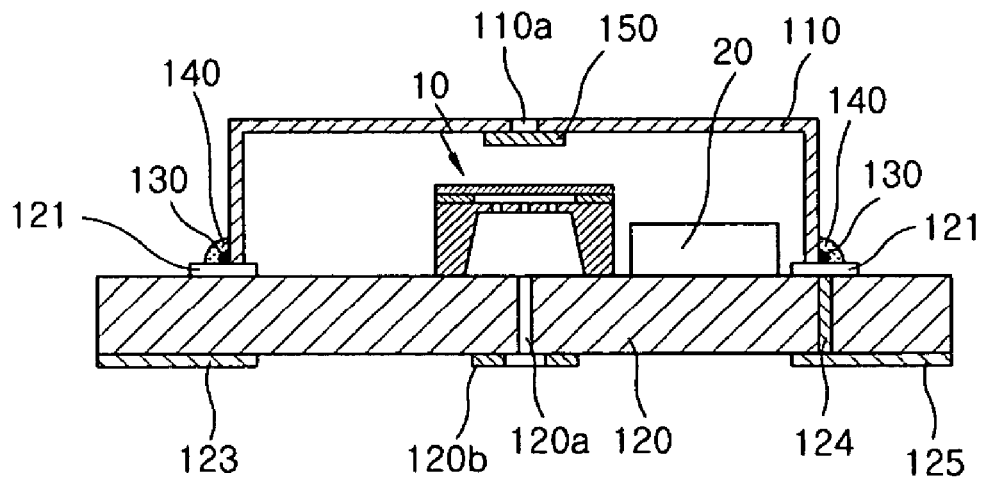
FIG. 20 is a sectional side view of a first modification of a third embodiment according to the present invention.
Figure 21:
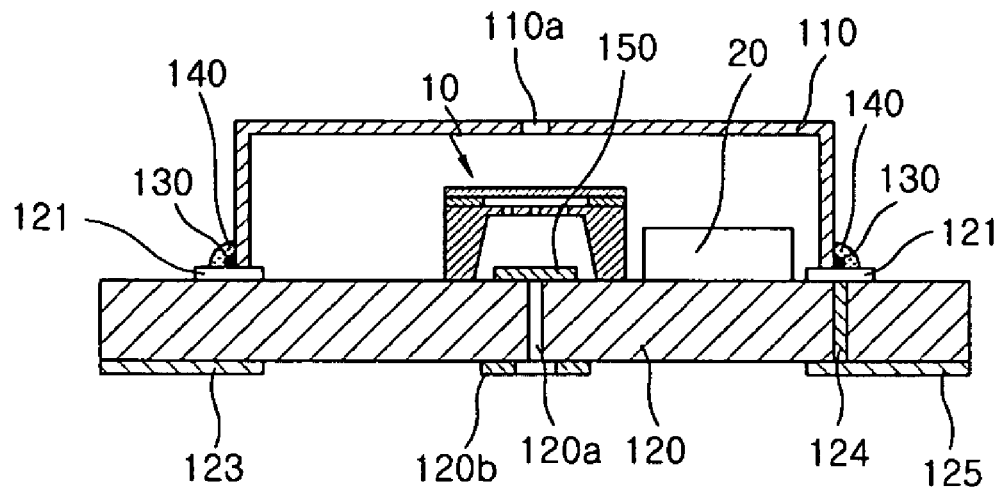
FIG. 21 is another sectional side view of a first modification of a third embodiment according to the present invention.

FIG. 19 is an exploded perspective view of a first modification of a third embodiment of a silicone condenser microphone according to the present invention, and FIGS. 20 and 21 are sectional side views of the first modification of the directional silicone condenser microphone according to the present invention. Here, FIG. 20 is a sectional view showing that a phase delayer 150 is attached to a case 110, and FIG. 21 a sectional view showing that the phase delayer 150 is attached to a board 120.

According to a first modification, as shown in FIGS. 19 to 21, a cylindrical metal case 110 which is formed with the first sound inlet hole 110a for collecting the first sound is tack-welded to a board 120 which is mounted with a MEMS chip 10 and an ASIC chip 20 by a laser to fix the case 110 to the board 120 and then the case 110 and the PCB 120 are bonded with an adhesive 140. Here, the adhesive 140 is any one selected from the group of conductive epoxy, nonconductive epoxy, silver paste, silicone, urethane, acryl and cream solder.

Referring to FIGS. 19 to 21, the board 120 is mounted with the MEMS chip 10 and the ASIC chip 20 and is formed with a circular connecting pattern 121 on its portion which contacts the metal case 110. Further, the board 120 is formed with the second sound inlet hole 120a for collecting the second sound on its portion where the MEMS chip 10 is positioned. A sealing terminal 120b is formed on the outside of the second sound inlet hole 120a.

Since the PCB 120 is broader than the metal case 110, connecting pads or connecting terminals for connecting with an external device can be freely disposed on the broad PCB. The connecting pattern 121 is formed by forming a copper clad through a general PCB manufacturing process and then plating the copper clad with Ni or Au. Here, the board 120 may be a PCB, a ceramic board, a FPCB or a metal PCB.

The metal case 110 has a cylindrical shape having an opening which faces the PCB 120 to receive the chip parts therein, wherein an upper surface thereof is formed with the first inlet sound hole 110a for collecting the first sound. The metal case 110 is made of any one selected from the group of brass, copper, stainless steel, aluminum, nickel alloy and the like. Further, the metal case may be plated with Au or Ag. The metal case may have various shapes such as a circle, a square, a shape having a skirt projected from an opened end of the case and the like.

The metal case 110 is aligned on the connecting pattern 121 of the PCB 120 and then the provisional spot welding point 130 between the case 110 and the PCB 120 is welded by a laser (not shown) to fix the case 110 to the board 120.

According to the microphone assembly packaged as described above, the metal case 110, as shown in FIGS. 20 and 21, is fixed to the connecting pattern 121 of the board 120 by provisional spot welding of the laser and then the metal case 110 is bonded to the board 120 with the adhesive 140. Further, The phase delayer 150 is installed on any one of the case 110 and the board 120 to delay the phase of the collected sound so that the microphone has directional characteristics.

Further, the board 120 is formed with connecting terminals 123 and 125 for connecting with the external device on a bottom surface thereof, wherein the number of the connecting terminals 123 and 125 may be two to eight. Each of the connecting terminals 123 and 125 is electrically connected through a through-hole 124 to a chip part surface of the board. Specially, according to the embodiment of the present invention, if extending the connecting terminals 123 and 125 to a circumference of the board 120, an electric soldering iron can access the exposed surface of the terminal, whereby a rework operation can be easily performed.

Modification 2 of Embodiment 3

Figure 22:
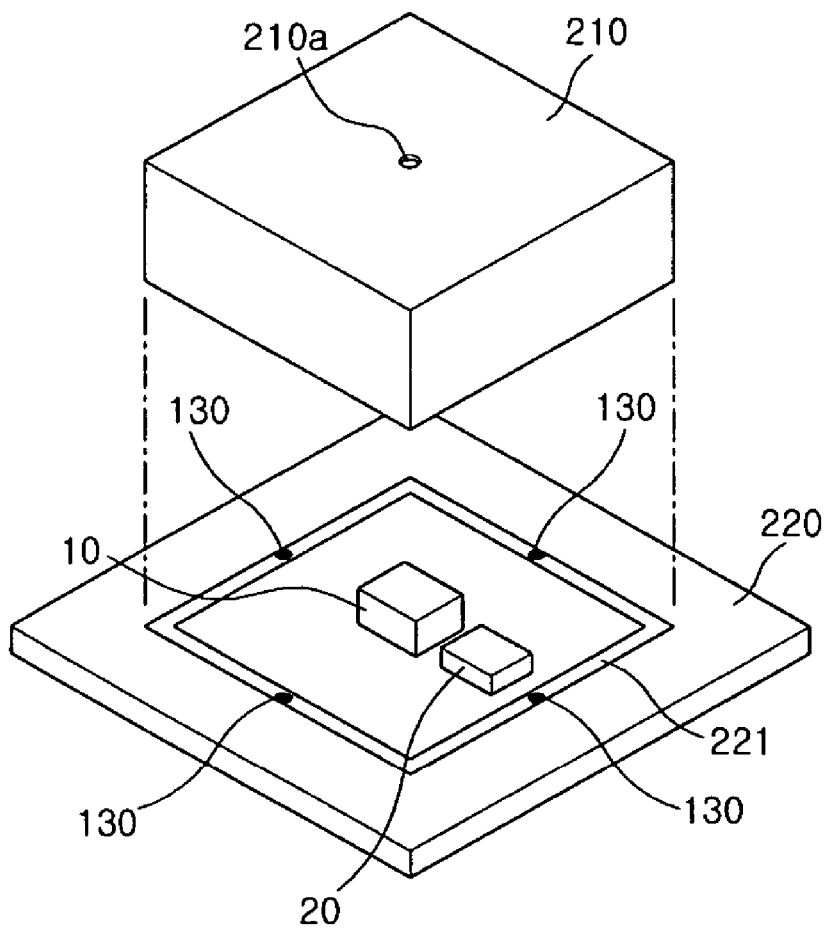
FIG. 22 is an exploded perspective view of a second modification of a third embodiment according to the present invention.

FIG. 22 is an exploded perspective view of a second modification of a third embodiment according to the present invention, wherein a rectangular parallelepiped shaped metal case 210 which is formed with the first sound inlet hole 210a for collecting the first sound is tack-welded to a PCB 220 which is formed with the second sound inlet hole for collecting the second sound by a laser to fix the case to the PCB and then the case is adhered to the PCB with an adhesive and finally the adhesive is cured.

Referring to FIG. 22, the board 220 is mounted with the MEMS chip 10 and the ASIC chip 20 and is formed with the second sound inlet hole for collecting the second sound on the position where the MEMS chip 10 is mounted. Further, the board is formed with a rectangular connecting pattern 221 on the portion which contacts the metal case 210, wherein the connecting pattern 221 is made of a copper clad film through a general PCB pattern forming technology.

The metal case 210 has a rectangular parallelepiped shape having an opening which faces the PCB 220, wherein an upper surface thereof is formed with the first sound inlet hole 210a for collecting the first sound.

The metal case 210 is aligned on the connecting pattern 221 of the PCB 220 and, provisional spot welding is performed for a connecting point on each side of the case using a laser (not shown). The provisional spot welding point 130, as shown in FIG. 7, is formed. Then, the adhesive 140 is applied to the whole circumference of the part where the case meets the board and then is cured to finish microphone packaging. Here, the connecting pattern 221 is connected with a ground terminal, wherein, if the metal case 210 is welded to the connecting pattern 221, there is a merit that it is easy to eliminate noise itself by interrupting noise collected from the outside.

As such, since the directional silicone condenser microphone assembly which is packaged as described above has the same structure as the microphone assembly of the first modification of a third embodiment except for the shape of the case, further explanation will be omitted to avoid repetition.

Modification 3 of Embodiment 3

Figure 23:
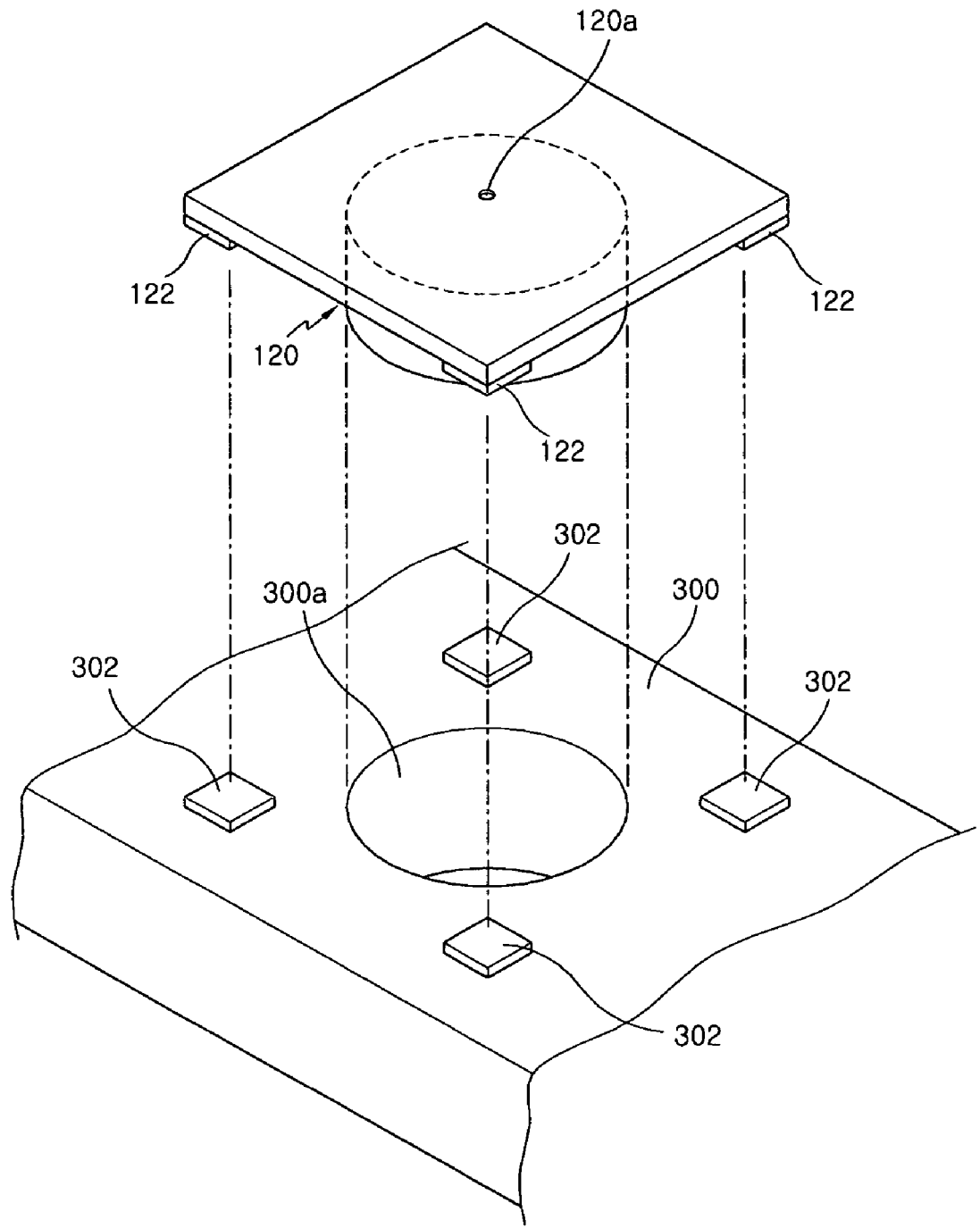
FIG. 23 is an exploded perspective view of a third modification of a third embodiment according to the present invention.
Figure 24:
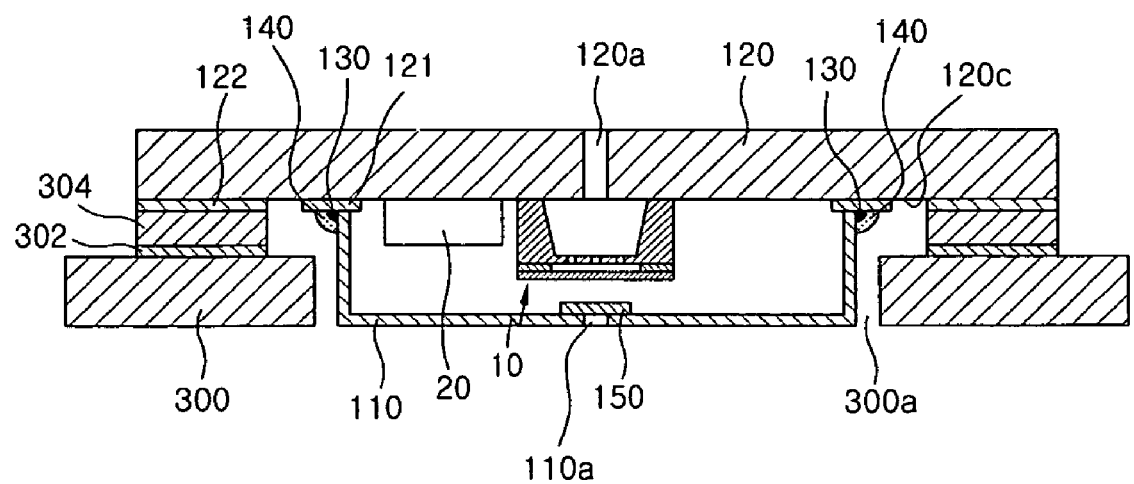
FIG. 24 is a sectional side view of a third modification of a third embodiment according to the present invention.

FIG. 23 is an exploded perspective view of a directional silicone condenser microphone having a board which is formed with connecting terminals on a part mounting side thereof, and FIG. 24 is a sectional side view showing that the directional silicone condenser microphone shown in FIG. 23 is mounted.

According to a directional silicone condenser microphone, as shown in FIGS. 23 and 24, a cylindrical metal case 110 having a bottom surface which is formed with the first sound inlet hole 110a for collecting the first sound is attached to a board 120 which is broader than the metal case 110 and is formed with the second sound inlet hole 120a for collecting the second sound by the adhesive 140. The board is formed with connecting terminals 122 which are connected with connecting pads 302 of a main PCB 300 of a product having the microphone on a part side 120c thereof.

Further, a main PCB 300 of the product having the directional silicone condenser microphone of the present invention is formed with a circular inserting hole 300a for mounting the case 110 of the directional silicone condenser microphone and is formed with the connecting pads 302 corresponding to the connecting terminals 122 which are formed on the board 120 of the microphone.

As such, according to a structure of FIG. 24 showing that the directional silicone condenser microphone is mounted on the main PCB 300, the metal case 110 projected from the central portion of the part side 120c of the board is inserted the inserting hole 300a of the main PCB 300, and the connecting pads 302 of the main PCB and the connecting terminals 122 of the microphone are connected by a solder 304.

Thus, according to a mounting method of the present invention, since the case 110 projected from the board of the microphone is inserted into the inserting hole 300a of the main PCB 300, a total height of an assembly according to the present invention is lower than that of an assembly assembled when the conventional microphone having the board which is formed with the connecting terminals on the reverse side of the part side thereof is mounted on the main PCB, thereby efficiently saving a space for mounting a part of the product.

The board 120 is mounted with the MEMS chip 10 and the ASIC chip 20 within the metal case 110 of the directional silicone condenser microphone. Further, the board 120 is formed with the second sound inlet hole 120a for collecting the second sound in the central portion thereof, and the phase delayer 150 for directivity is attached to the inside of the first sound inlet hole 110a. Here, although there is not shown in the drawing, the sound resistor 150 may be attached to the inside and outside of the first sound inlet hole 110a or the inside and outside of the second sound inlet hole 120a.

According to the packaged directional microphone assembly shown in FIG. 24, the metal case 110 is fixed to the PCB 120 which is mounted with the MEMS chip 10 and the ASIC chip 20 by laser provisional spot welding and then the metal case 110 is bonded to the connecting pattern 121 of the PCB 120 with the adhesive 140.

The metal case 110 is formed with the first sound inlet hole 110a for collecting the first sound on a portion thereof corresponding to a position of the MEMS chip 10, and the PCB 120 is formed with the second sound inlet hole 120a for collecting the second sound on a portion thereof corresponding to a position where the MEMS chip 10 is mounted. The sound resistor 150 is attached to the inside of the first sound inlet hole 110a.

According to this structure of the third modification, the sound collected through the first sound inlet hole 110a or the modification sound inlet hole 120a passes through the phase delayer 150 and then its phase is changed, thereby obtaining directivity.

From the foregoing, the metal case is tack-welded to the board by the laser to fix the case to the board and then bonds the case to the board with the adhesive, thereby decreasing an inferiority ratio and strengthening a joining force and thus enhancing a mechanical firmness and highly resisting noise from the outside. As a result, the process expense is saved, thereby sharply cutting a total manufacturing cost.

Further, the conventional curling process for joining a metal case with a PCB is removed and the metal case is joined to the PCB which is mounted with condenser microphone parts with the adhesive, thereby enhancing an electrical conductivity between the case and the PCB and also enhancing a sound characteristic by sealing the case so that a sound pressure from the outside does not enter the case.

Further, since a shape of the PCB is not limited by the size of the case, the PCB which is used for the microphone is freely designed, thereby forming various shapes of terminals. Further, since assembly can be performed without physical force applied in a curling process, a thinner PCB can be adapted. As a result, the height of a product can be lowered, whereby a thinner microphone can be manufactured.

What is claimed is:

1. A silicone based condenser microphone comprising:
a metal case which includes a sound hole;
a board which is mounted with a Micro Electro Mechanical System (MEMS) microphone chip and an application specific integrated circuit (ASIC) chip having a electric voltage pump and a buffer IC and is formed with a connecting pattern for joining with the metal case;
two to four provisional spot welding points for fixing the metal case to the connecting pattern of the board by provisional spot welding; and
an adhesive for applying to the portion of the metal case that is joined with the board to bond the metal case to the board.

2. The silicone based condenser microphone according to claim 1, wherein the provisional spot welding point is formed by laser welding or soldering.

3. The silicone based condenser microphone according to claim 1,
wherein the adhesive is any one selected from the group of conductive epoxy, nonconductive epoxy, silver paste, silicone, urethane, acryl and cream solder.

4. The silicone based condenser microphone according to claim 1,
wherein the metal case has any one of a cylindrical shape and a rectangular parallelepiped shape.

5. The silicone based condenser microphone according to claim 4, wherein an end of the metal case has a skirt shape which is formed by bending the end outwardly.

6. The silicone based condenser microphone according to claim 1,
wherein the board is any one selected from the group of a printed circuit board (PCB), a
ceramic board, a flexible PCB (FPCB) and a metal PCB.

7. The silicone based condenser microphone according to claim 1,
wherein the metal case is made of any one selected from the group of brass, aluminum and nickel alloy.

8. The silicone based condenser microphone according to claim 1, wherein the board is formed with connecting terminals for connecting with an external circuit on a reverse side of the side which has the metal case mounted thereon.

9. The silicone based condenser microphone according to claim 1, wherein the board is formed with connecting terminals for connecting with an external circuit on the side which has the metal case mounted thereon.

10. A method for packaging a silicone based condenser microphone, the
method comprising the steps of:
inputting a board which is mounted with a Micro Electro Mechanical System (MEMS) chip and an application specific integrated circuit (ASIC) chip and is formed with a connecting pattern;
inputting a metal case;
aligning the metal case on the connecting pattern of the board;
fixing the metal case to the connecting pattern of the board by provisional spot welding at two to four points to fix the metal case to the connecting pattern;
bonding the entirety of a perimeter of the metal case to the board with an adhesive; and
curing the adhesive.

11. A silicone based condenser microphone comprising:
a metal case having a bottom surface which is closed;
a board which is formed with a sound hole for collecting an external sound and a sealing terminal for solder-sealing the sound hole to prevent distortion of a sound wave in the space between a main printed circuit board (PCB) and the microphone, the board being mounted with a Micro Electro Mechanical System (MEMS) microphone chip and an application specific integrated circuit (ASIC) chip having an electric voltage pump and a buffer IC, the board being formed with a connecting pattern for joining with the metal case;

two to four provisional laser spot welding points for fixing the metal case to the connecting pattern of the board by provisional laser spot welding; and an adhesive for applying to a perimeter of the case where the metal case meets the board to bond the metal case to the board.

12. The silicone based condenser microphone according to claim 11, wherein the adhesive is any one selected from the group of conductive epoxy, nonconductive epoxy, silver paste, silicone, urethane, acryl and cream solder.

13. The silicone based condenser microphone according to claim 11, wherein the sound hole of the board is formed on the position where the MEMS chip is mounted.

14. A directional silicone condenser microphone comprising:

a metal case which is formed with the first sound inlet hole for collecting the first sound;

a board which is formed with the second sound inlet hole for collecting a second sound, the board being mounted with a Micro Electro Mechanical System (MEMS) microphone chip and an application specific integrated circuit (ASIC) chip having a electric voltage pump and a buffer IC and being formed with a connecting pattern for joining with the metal case;

a phase delayer for delaying the phase of sound collected through the first sound inlet hole or the second sound inlet hole;

at least one provisional spot welding point for fixing the metal case to the connecting pattern of the board by provisional spot welding: and an adhesive for applying to a perimeter of the case where the metal case meets the board to bond the metal case to the board.

15. The directional silicone condenser microphone according to claim 14, wherein the provisional spot welding point is formed by laser welding or soldering.

16. The directional silicone condenser microphone according to claim 14, wherein the adhesive is any one selected from the group of conductive epoxy, nonconductive epoxy, silver paste, silicone, urethane, acryl and cream solder.

17. The directional silicone condenser microphone according to claim 14, wherein the board is formed with connecting terminals for connecting with an external circuit on a reverse side of the side where the metal case is mounted.

18. The directional silicone condenser microphone according to claim 14, wherein the board is formed with connecting terminals for connecting with an external circuit on the side where the metal case is mounted.

19. The directional silicone condenser microphone according to claim 14, wherein the phase delayer is mounted on any one of the inside of the first sound inlet hole of the metal case, the outside of the first sound inlet hole of the metal case, the inside of the second sound inlet hole of the board and the outside of the second sound inlet hole of the board.

* * * * *